(12) United States Patent
Kim

(10) Patent No.: US 7,846,809 B2
(45) Date of Patent: Dec. 7, 2010

(54) METHOD FOR FORMING CAPACITOR OF SEMICONDUCTOR DEVICE

(75) Inventor: Gyu Hyun Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 131 days.

(21) Appl. No.: 11/965,901

(22) Filed: Dec. 28, 2007

(65) Prior Publication Data

US 2008/0188056 A1  Aug. 7, 2008

(30) Foreign Application Priority Data

Feb. 6, 2007  (KR) .................. 10-2007-0012364

(51) Int. Cl.
*H01L 21/20*  (2006.01)
*H01L 21/8242*  (2006.01)

(52) U.S. Cl. ............... 438/397; 438/396; 438/398; 438/399; 438/243; 438/244; 438/254; 438/255; 438/256; 257/301; 257/306; 257/E21.648; 257/E21.66; 257/E21.651

(58) Field of Classification Search .......... 438/397
See application file for complete search history.

(56) References Cited

U.S. PATENT DOCUMENTS

| 5,552,334 | A | * | 9/1996 | Tseng | 438/254 |
| 6,077,742 | A | * | 6/2000 | Chen et al. | 438/255 |
| 6,200,898 | B1 | * | 3/2001 | Tu | 438/692 |
| 6,268,244 | B1 | * | 7/2001 | Park | 438/253 |
| 6,342,419 | B1 | * | 1/2002 | Tu | 438/253 |
| 6,784,068 | B2 | * | 8/2004 | Lee et al. | 438/396 |
| 7,498,267 | B2 | * | 3/2009 | Kim et al. | 438/706 |
| 2002/0024085 | A1 | * | 2/2002 | Nakamura et al. | 257/306 |
| 2005/0116318 | A1 | * | 6/2005 | Park | 257/532 |
| 2006/0088991 | A1 | * | 4/2006 | Kim | 438/597 |
| 2006/0189064 | A1 | * | 8/2006 | Shim et al. | 438/210 |

FOREIGN PATENT DOCUMENTS

| KR | 2004-0002010 A | 1/2004 |
| KR | 2004-0060129 A | 7/2004 |
| KR | 2005-0018074 A | 2/2005 |
| KR | 2005-0073211 A | 7/2005 |
| KR | 2006-0029731 A | 4/2006 |
| KR | 2006-0068199 A | 6/2006 |

* cited by examiner

*Primary Examiner*—Charles D Garber
*Assistant Examiner*—Pape Sene
(74) *Attorney, Agent, or Firm*—Ladas & Parry LLP

(57) ABSTRACT

A method for forming a capacitor of a semiconductor device includes the steps of forming first and second sacrificial insulation layers over a semiconductor substrate divided into first and second regions. The second and first sacrificial insulation layers in the first region are etched to define in the first region of the semiconductor substrate. Storage nodes on surfaces of the holes are formed. A partial thickness of the second sacrificial insulation layer is etched to partially expose upper portions of the storage nodes. A mask pattern is formed to cover the first region while exposing the second sacrificial insulation layer remaining in the second region. The exposed second sacrificial insulation layer in the second region is removed to expose the first sacrificial insulation layer in the second region. The exposed first sacrificial insulation layer in the second region and the first sacrificial insulation layer in the first region is removed. The mask pattern is removed. The second sacrificial insulation layer remaining in the first region is removed.

16 Claims, 6 Drawing Sheets

METHOD FOR FORMING CAPACITOR OF SEMICONDUCTOR DEVICE

CROSS-REFERENCE TO RELATED APPLICATIONS

The present application claims priority to Korean patent application number 10-2007-0012364 filed on Feb. 6, 2007, which is incorporated herein by reference in its entirety.

BACKGROUND OF THE INVENTION

The present invention relates to a method for forming a capacitor of a semiconductor device, and more particularly, to a method for forming a capacitor of a semiconductor device which can prevent a storage node from leaning.

In a memory device such as a DRAM (dynamic random access memory), the area designated to be occupied by a capacitor for storing data decreases. As such, various alternatives for securing a high capacitance have been proposed in the art. Also, an MIM (metal-insulator-metal) capacitor has recently come to the forefront. In the MIM capacitor a metal having a large work function is adopted as the material for the electrodes in order to provide a high-performance memory device.

In general, in order to secure high capacitance, a dielectric layer having a high dielectric constant is used, the surface area of the electrode is increased, and the distance between electrodes is decreased. However, limitations exist when decreasing the distance between electrodes (the thickness of a dielectric layer). Therefore, high capacitance is typically secured by using a dielectric layer having a high dielectric constant or increasing the surface area of an electrode.

In a method for increasing the surface area of an electrode, a storage node can be formed as a concave type storage node or a cylinder type storage node. In recent designs, the cylinder type storage node has been preferred over the concave type storage node. The reason behind this resides in that limitations exist when increasing the height of a capacitor as the area of the capacitor decreases due to the decrease in the size of a cell; as such, it is difficult to sufficiently secure the surface area of an electrode in a capacitor having a concave type storage node. Therefore, the cylinder type capacitor has been preferred to the concave type capacitor, because the concave type storage node only uses the inside area of a storage node, while the cylinder type storage node uses both the inside and outside areas of a storage node.

Hereinbelow, a conventional method for forming a cylinder type MIM capacitor will be schematically described with reference to FIGS. 1A and 1B.

Referring to FIG. 1A, a semiconductor substrate 110 is first prepared. The semiconductor substrate 110 is divided into a cell region and a peripheral region, each having predeposition layers. An interlayer dielectric 120 is formed on the semiconductor substrate 110. Storage node contacts 130 are formed in specified portions of the interlayer dielectric 120 in the cell region. A sacrificial insulation layer 150 having a substantial thickness is deposited on the interlayer dielectric 120 including the storage node contacts 130. The sacrificial insulation layer 150 is then etched to define holes that both expose the storage node contacts 130 and delimit areas in which storage nodes are to be formed. A metal layer for storage nodes is deposited on the surfaces of the holes and on the sacrificial insulation layer 150, and then a portion of the metal layer deposited on the sacrificial insulation layer 150 is removed to form storage nodes 170.

Referring to FIG. 1B, the sacrificial insulation layer 150 is removed through wet etching using BOE (buffered oxide etchant), thus completing the formation of the cylinder type storage nodes 170 in the cell region. A rinsing process using DI (deionized) water is implemented on the resultant semiconductor substrate 110 formed with the cylinder type storage nodes 170 so as to remove any remaining foreign substance (for example an etching solution). A drying process is then implemented to remove the DI water.

Thereupon, while not shown in the drawings, both a dielectric layer and a metal layer for plate nodes is formed on the cylinder type storage nodes 170. The metal layer for plate nodes and the dielectric layer are then etched, and plate nodes are formed, whereby cylinder type capacitors composed of the storage nodes 170, the dielectric layer, and the plate nodes are formed.

In the conventional art as described above, when forming the cylinder type storage nodes 170, the sacrificial insulation layer 150 is removed by implementing the wet etching process and the rinsing process. When the wet etching process and the rinsing process are conducted, if any remnants remaining on the surface of the semiconductor substrate 110 are not displaced by IPA (isopropyl alcohol), a water drop may be present between adjoining storage nodes; and due to the water drop, a water mark may be produced in the subsequent drying process for removing the remnants of the wet etching and drying process.

In this situation, as shown in FIG. 2, the presence of the water mark generates surface tension causing a bridge to be formed between the adjoining storage nodes 170, as a result of which leaning of the storage nodes 170 is caused. If this leaning of the storage nodes 170 occurs at one place in each die of a DRAM device, since it is impossible to repair the leaning, a detrimental influence is exerted on the manufacturing yield of a semiconductor device.

SUMMARY OF THE INVENTION

Embodiments of the present invention are directed to a method for forming a capacitor of a semiconductor device which can prevent the generation of water marks.

Also, embodiments of the present invention are directed to a method for forming a capacitor of a semiconductor device which can prevent a storage node from leaning.

Further, embodiments of the present invention are directed to a method for forming a capacitor of a semiconductor device which can prevent a decrease in the manufacturing yield caused by the leaning of a storage node.

In one aspect, a method for forming a capacitor of a semiconductor device comprises the steps of forming a first sacrificial insulation layer and a second sacrificial insulation layer on a semiconductor substrate which is divided into a first region and a second region; etching the second sacrificial insulation layer and the first sacrificial insulation layer to define holes in the first region of the semiconductor substrate; forming storage nodes on surfaces of the holes; etching a partial thickness of the second sacrificial insulation layer to partially expose upper portions of the storage nodes; forming a mask pattern selectively covering the first region on the etched second sacrificial insulation layer, wherein the second sacrificial insulation layer remaining in the second region is not covered by the mask pattern; removing the exposed portion of the second sacrificial insulation layer in the second region; removing the exposed first sacrificial insulation layer in the second region and the first sacrificial insulation layer in the first region; removing the mask pattern; and removing the second sacrificial insulation layer remaining in the first region to finally obtain cylinder type storage nodes.

The first region is a cell region, and the second region is a peripheral region.

The first sacrificial insulation layer is preferably formed as any one of a PSG layer, an $O_3$-TEOS layer, an $O_3$-USG layer and an SOD layer.

The second sacrificial insulation layer is preferably formed as a PE-TEOS layer.

The storage nodes preferably comprise at least one of a TiN layer, a W layer, and an Ru layer.

The step of etching the partial thickness of the second sacrificial insulation layer is implemented through a wet etching process. The wet etching process is implemented using a mixed solution of $NH_4F$, HF and $H_2O$. In the mixed solution, $NH_4F$, HF and $H_2O$ are mixed in the ratio of 16~18:1~2:80~83, preferably, 17:1.7:81.3.

The mask pattern preferably comprises a photoresist.

The step of removing the remained second sacrificial insulation layer in the second region is implemented through a dry etching process.

The step of removing the exposed first sacrificial insulation layer exposed in the second region and the first sacrificial insulation layer in the first region is implemented through a wet etching process.

The wet etching process is implemented using a mixed solution of $NH_4F$, HF and $H_2O$. In the mixed solution, $NH_4F$, HF and $H_2O$ are mixed in the ratio of 16~18:1~2:80~83, preferably, 17:1.7:81.3.

The step of removing the portion of the second sacrificial insulation layer remaining in the first region is implemented through an etching process using anhydrous HF gas.

DESCRIPTION OF SPECIFIC EMBODIMENT

In the present invention, a sacrificial insulation layer used when forming cylinder type storage nodes is formed to have a double-layered structure including a first sacrificial insulation layer and a second sacrificial insulation layer. The sacrificial insulation layer formed in the double-layered structure including the first sacrificial insulation layer and the second sacrificial insulation layer is removed by implementing wet etching processes, a dry etching process and an etching process using anhydrous HF gas.

More specifically, in the present invention, a sacrificial insulation layer is formed to have a double-layered structure including a first sacrificial insulation layer made of PSG (phosphorous silicate glass) and a second sacrificial insulation layer made of PE-TEOS (plasma enhanced-tetra ethyl ortho silicate). A partial thickness of the second sacrificial insulation layer made of PE-TEOS is etched by a wet etching process using a mixed solution of $NH_4F$, HF and $H_2O$. The portion of the etched second sacrificial insulation layer that is located in a peripheral region is removed by a dry etching process. The portion of the etched second sacrificial insulation layer located in a cell region and the first sacrificial insulation layer are removed by a wet etching process. Then, any remnants of the first and second sacrificial insulation layers are completely removed by an etching process using anhydrous HF gas.

In the present invention, since the sacrificial insulation layer is completely removed through the wet etching processes, the dry etching process, and the etching process using the anhydrous HF gas; the rinsing process and the drying process implemented in the conventional art to remove the sacrificial insulation layer can be omitted.

Therefore, in the present invention, by omitting the rinsing process and the drying process of the conventional art, it is possible to prevent the water marks that cause the leaning of a storage node from being produced. Preventing the leaning of a storage node prevents any decrease in the manufacturing yield of a semiconductor device caused by the leaning of a storage node.

Hereafter, a specific embodiment of the present invention will be described with reference to the attached drawings.

FIGS. 3A through 3G are cross-sectional views illustrating the processes of a method for forming a cylinder type MIM capacitor of a semiconductor device in accordance with an embodiment of the present invention.

Figure 1A:
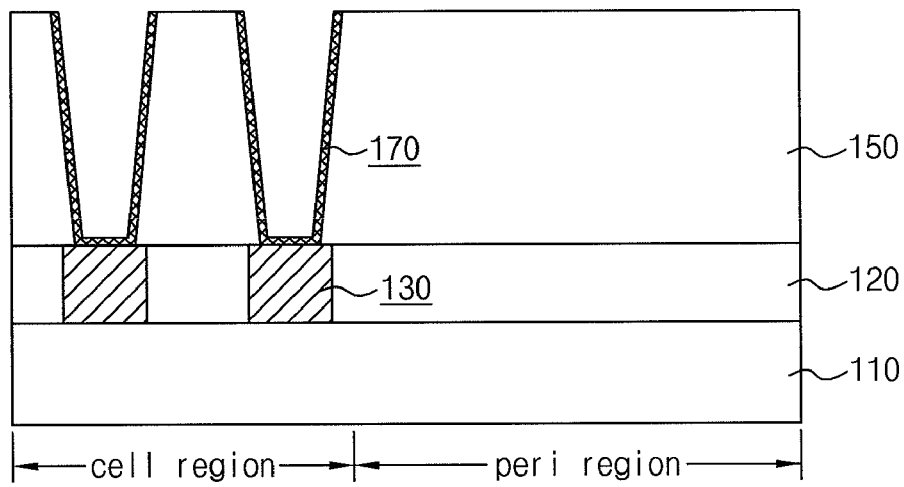
FIGS. 1A and 1B are cross-sectional views illustrating the processes of a conventional method for forming a cylinder type MIM capacitor of a semiconductor device.
Figure 1B:
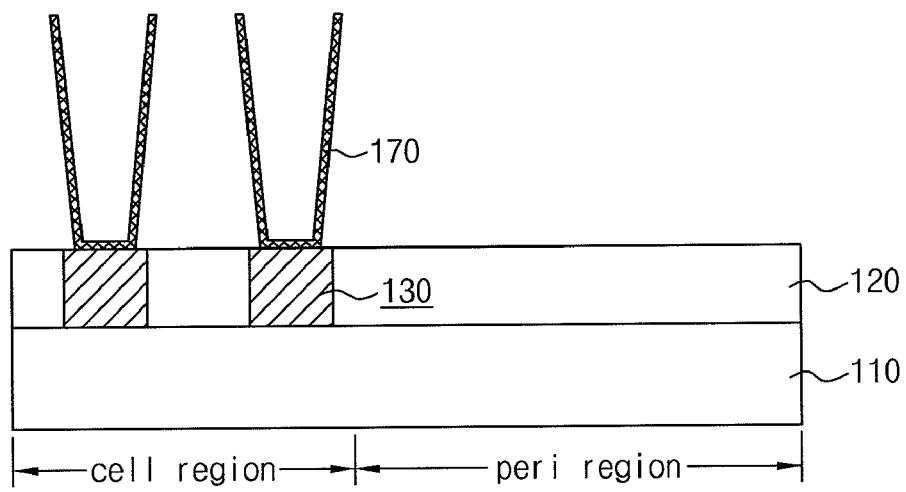
Figure 2:
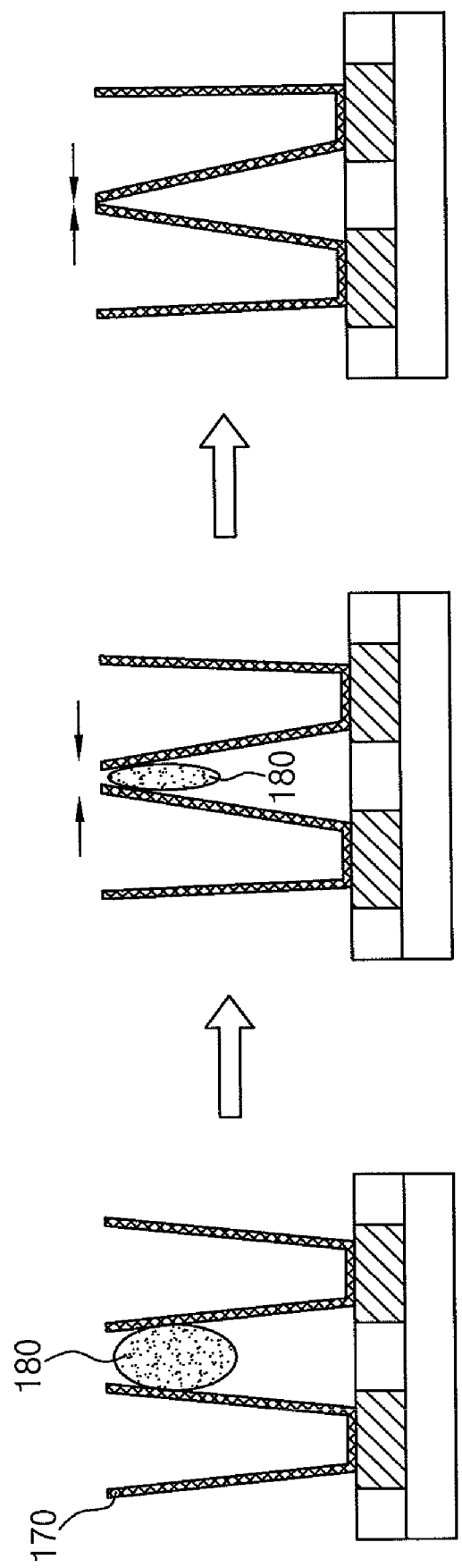
FIG. 2 is a view illustrating the problems caused in the conventional method.
Figure 3A:
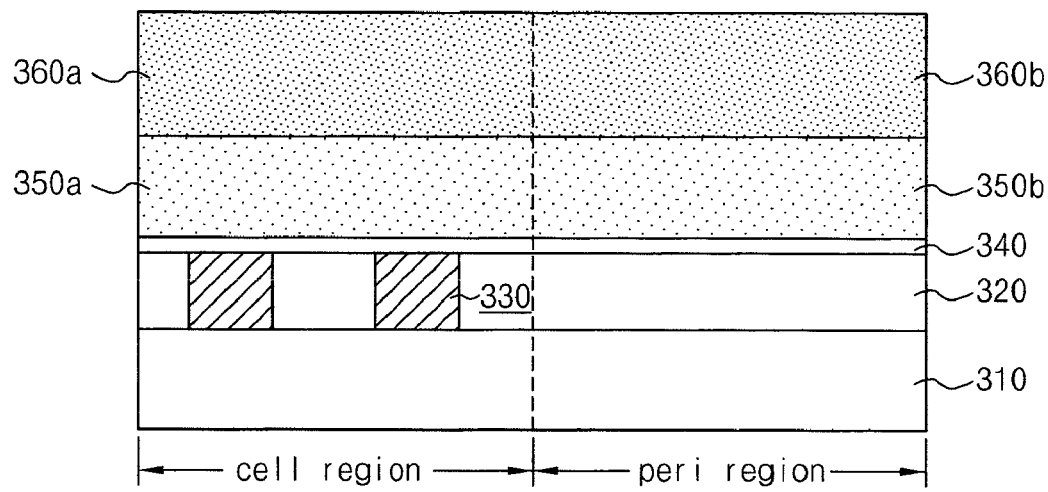
FIGS. 3A through 3G are cross-sectional views illustrating the processes of a method for forming a cylinder type MIM capacitor of a semiconductor device in accordance with an embodiment of the present invention.

Referring to FIG. 3A, a semiconductor substrate 310 is prepared. The semiconductor substrate 310 is divided into a first region and a second region, that is, a cell region and a peripheral region. The first and second regions have respective predeposition layers (not shown) including transistors. An interlayer dielectric 320 is formed on the semiconductor substrate 310. Contact holes are defined by etching portions of the interlayer dielectric 320 in the cell region. A polysilicon layer is filled in the contact holes to form storage node contacts 330. An etch stop layer 340 comprising a nitride layer is formed on the interlayer dielectric 320 including the storage node contacts 330 to a thickness in the range of 700~900 Å. A first sacrificial insulation layer 350a and 350b and a second sacrificial insulation layer 360a and 360b are sequentially formed on the etch stop layer 340.

The first sacrificial insulation layer 350a and 350b is formed as any one of a PSG layer, an $O_3$-TEOS ($O_3$-tetra ethyl ortho silicate) layer, an $O_3$-USG ($O_3$-undoped silicate glass) layer, and an SOD (spin-on dielectric) layer; and preferably, the first sacrificial insulation layer 350a and 350b is a PSG layer. The second 10 sacrificial insulation layer is formed as a PE-TEOS layer. The overall thickness of the sacrificial insulation layer having a double-layered structure including the first sacrificial insulation layer 350a and 350b and the second sacrificial insulation layer 360a and 360b corresponds to the desired height of the subsequently formed storage nodes.

Figure 3B:
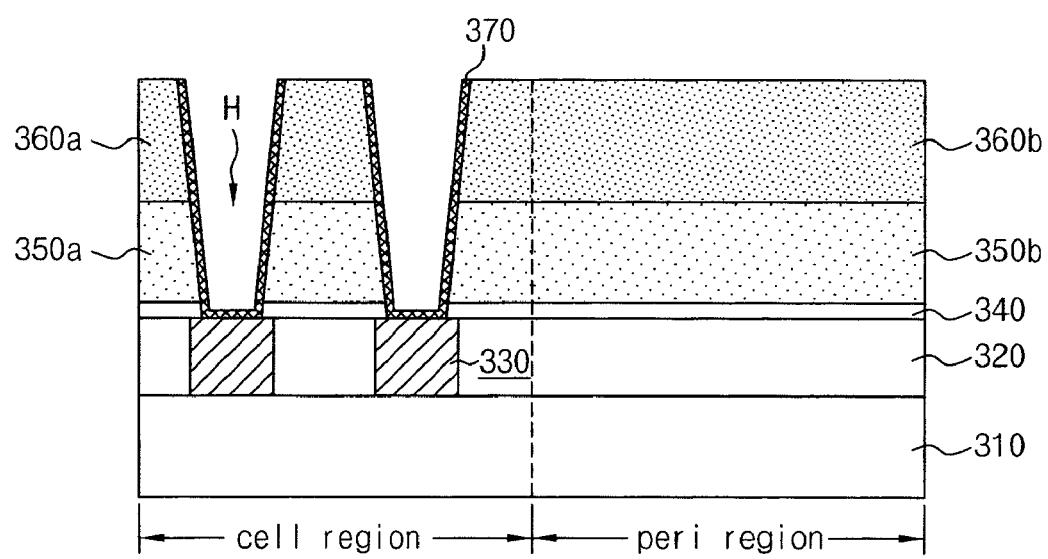

Referring to FIG. 3B, the second and first sacrificial insulation layers 360a and 350a and the etch stop layer 340 in the cell region are etched to define holes H that both expose the storage node contacts 330 and delimit areas in which storage nodes are to be formed. A metal layer for storage nodes is deposited on the surfaces of the holes H and on the second sacrificial insulation layer 360a and 360b. The portion of the metal layer deposited on the second sacrificial insulation layer 360a and 360b is removed to form storage nodes 370 on the surfaces of the holes H. The metal layer for storage nodes comprises any one of a TiN layer, a W layer, and an Ru layer.

Figure 3C:
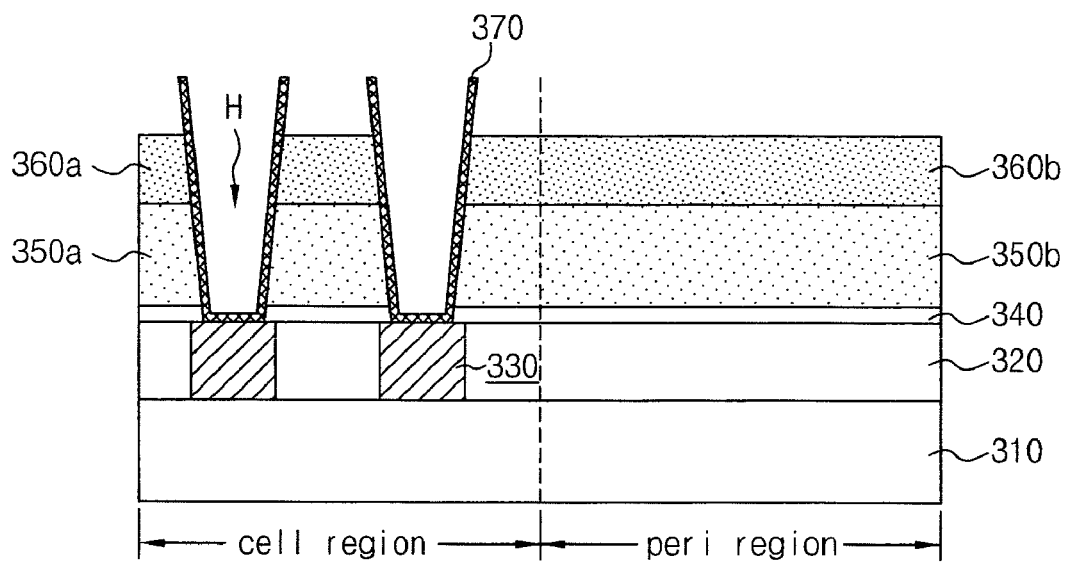

Referring to FIG. 3C, a partial thickness of the second sacrificial insulation layer 360a and 360b is removed by wet etching to partially expose the upper portions of the storage nodes 370. Etching of the second sacrificial insulation layer 360a and 360b is implemented through a wet etching process using a solution in which NH$_4$F, HF, and H$_2$O are mixed in a ratio in the range of 16~18:1~2:80~83; and preferably, 17:1.7:81.3.

Figure 3D:
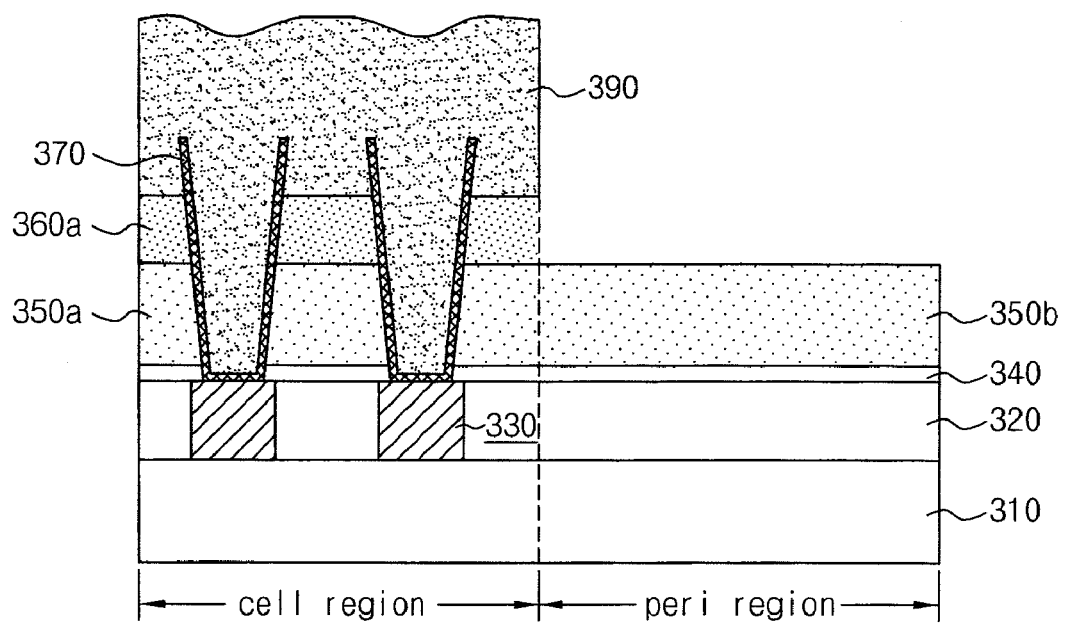

Referring to FIG. 3D, a photoresist is deposited on the resultant semiconductor substrate 310 to fill the holes H including the storage nodes 370, and then through exposure and development of the photoresist, a mask pattern 390 is formed to cover the cell region and expose the peripheral region. Using the mask pattern 390 as an etch mask, the portion of the second sacrificial insulation layer 360b exposed in the peripheral region is removed through a dry etching process.

Herein, removing the portion of the second sacrificial insulation layer 360b exposed in the peripheral region through a dry etching process prevents the second sacrificial insulation layer 360a in the cell region from being etched. That is to say, if the portion of the second sacrificial insulation layer 360b exposed in the peripheral region had been etched through a wet etching process rather than a dry etching process, the second sacrificial insulation layer 360a in the cell region would have been partially etched.

Figure 3E:
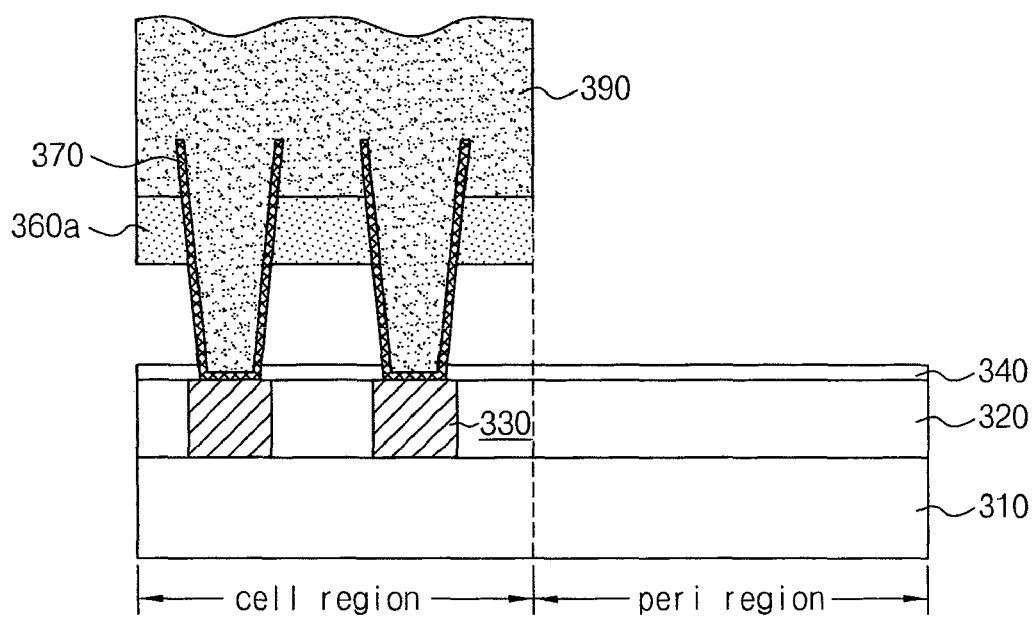

Referring to FIG. 3E, the first sacrificial insulation layer 350b exposed in the peripheral region and the first sacrificial insulation layer 350a in the cell region are removed, such that the second sacrificial insulation layer 360a in the cell region supports the storage nodes 370. The removal of the first sacrificial insulation layer 350b and 350a is implemented through a wet etching process using a solution in which NH$_4$F, HF, and H$_2$O are mixed in a ratio in the range of 16~18:1~2:80~83; and preferably, 17:1.7:81.3.

Figure 3F:
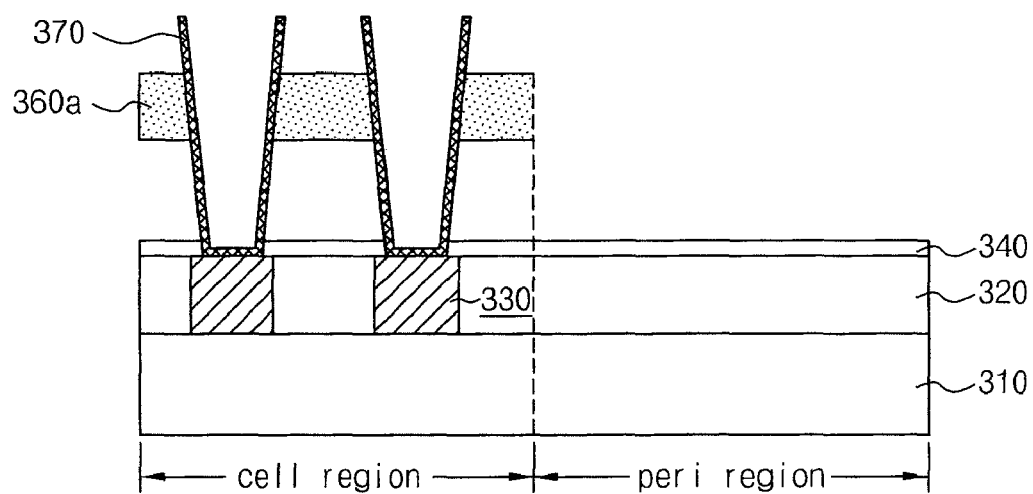

Referring to FIG. 3F, the mask pattern 390 is removed to expose the portion of the second sacrificial insulation layer 360a remaining in the cell region.

Figure 3G:
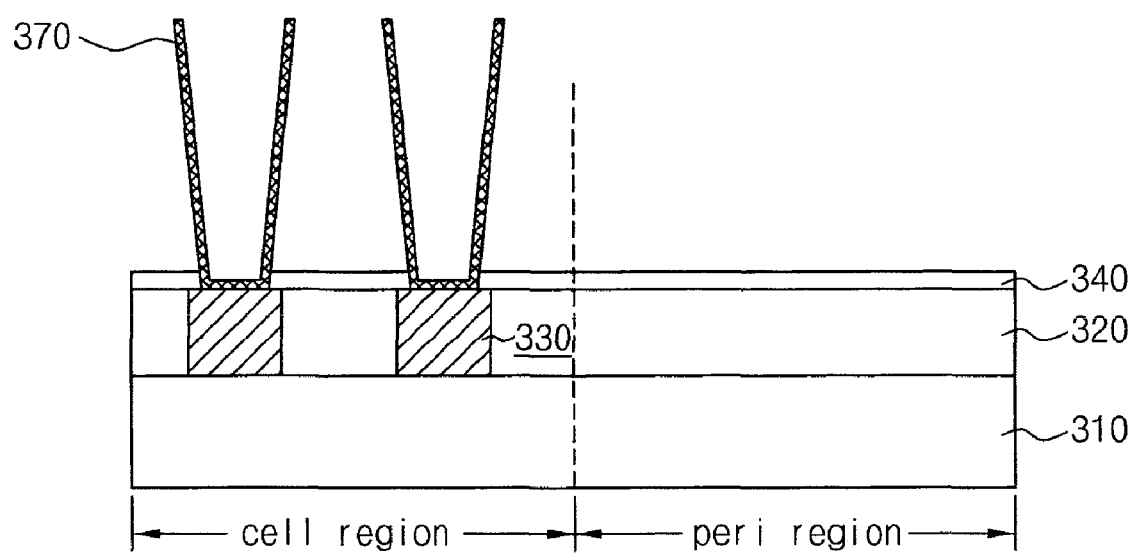

Referring to FIG. 3G, the portion of the second sacrificial insulation layer 360a exposed in the cell region due to the removal of the mask pattern 390 is completely removed through an etching process using anhydrous HF gas, thus forming cylinder type storage nodes 370.

Thereafter, while not shown in the drawings, by forming a dielectric layer and metal plate nodes on the cylinder type storage nodes 370, cylinder type MIM capacitors according to the present embodiment of the subject invention are manufactured.

As described above, in the present invention, after removing the portion of the second sacrificial insulation layer 360b exposed in the peripheral region and the first sacrificial insulation layer 350a and 350b in the cell and peripheral regions through the above described dry and wet etching processes, the portion of the second sacrificial insulation layer 360a remaining in a partial thickness between storage nodes 370 in the cell region is completely removed through etching using anhydrous HF gas.

As is apparent from the above description, the present invention provides advantages by completely and finally removing the remaining portion of a second sacrificial insulation layer through an etching process using anhydrous HF gas. By removing the remaining portion of a second sacrificial insulation layer in this manner, the rinsing and drying processes of the conventional art that are used to remove a sacrificial insulation layer used in forming cylinder type storage nodes can be omitted. As a result, in the present invention, it is possible to prevent a water mark from being produced between storage nodes due to the prior art rinsing and drying processes during the formation of cylinder type storage nodes; and as a result, it is possible to prevent both the storage nodes from leaning due to the presence of the water mark and the decrease in manufacturing yield of a semiconductor device.

Although a specific embodiment of the present invention has been described for illustrative purposes, those skilled in the art will appreciate that various modifications, additions and substitutions are possible without departing from the scope and the spirit of the invention as disclosed in the accompanying claims.

What is claimed is:

1. A method for forming a capacitor of a semiconductor device, comprising the steps of:
   forming a first sacrificial insulation layer and a second sacrificial insulation layer over a semiconductor substrate which is divided into a first region and a second region;
   etching the second sacrificial insulation layer and the first sacrificial insulation layer in the first region to define holes in the first region of the semiconductor substrate;
   forming storage nodes on surfaces of the holes;
   etching a partial thickness of the second sacrificial insulation layer to partially expose upper portions of the storage nodes;
   forming a mask pattern selectively covering the first region on the etched second sacrificial insulation layer, wherein the second sacrificial insulation layer remaining in the second region is not covered by the mask pattern;
   removing the second sacrificial insulation layer remaining in the second region to expose the first sacrificial insulation layer in the second region;
   after removing the second sacrificial insulation layer remaining in the second region, removing the exposed first sacrificial insulation layer in the second region and the first sacrificial insulation layer in the first region, the second sacrificial insulation layer remaining in the first region to support an upper portion of the storage nodes;
   removing the mask pattern; and
   removing the second sacrificial insulation layer remaining in the first region.

2. The method according to claim 1, wherein the first region is a cell region, and the second region is a peripheral region.

3. The method according to claim 1, wherein the first sacrificial insulation layer comprises any one of a PSG layer, an O$_3$-TEOS layer, an O$_3$-USG layer and an SOD layer.

4. The method according to claim 1, wherein the second sacrificial insulation layer comprises a PE-TEOS layer.

5. The method according to claim 1, wherein the storage nodes comprise at least one of a TiN layer, a W layer, and an Ru layer.

6. The method according to claim 1, wherein the step of etching the partial thickness of the second sacrificial insulation layer is implemented through a wet etching process.

7. The method according to claim 6, wherein the wet etching process is implemented using a mixed solution of NH$_4$F, HF, and H$_2$O.

8. The method according to claim 7, wherein, in the mixed solution, NH$_4$F, HF, and H$_2$O are mixed in a ratio in the range of 16~18:1~2:80~83.

9. The method according to claim 8, wherein, in the mixed solution, NH$_4$F, HF, and H$_2$O are mixed in the ratio of 17:1.7:81.3.

10. The method according to claim 1, wherein the mask pattern comprises a photoresist.

11. The method according to claim 1, wherein the step of removing second sacrificial insulation layer remaining in the second region is implemented through a dry etching process.

12. The method according to claim 1, wherein the step of removing the exposed first sacrificial insulation layer in the second region and the first sacrificial insulation layer in the first region is implemented through a wet etching process.

13. The method according to claim 12, wherein the wet etching process is implemented using a mixed solution of $NH_4F$, HF, and $H_2O$.

14. The method according to claim 13, wherein, in the mixed solution, $NH_4F$, HF, and $H_2O$ are mixed in a ratio in the range of 16~18:1~2:80~83.

15. The method according to claim 14, wherein, in the mixed solution, $NH_4F$, HF, and $H_2O$ are mixed in the ratio of 17:1.7:81.3.

16. The method according to claim 1, wherein the step of removing the portion of the second sacrificial insulation layer remaining in the first region is implemented through an etching process using anhydrous HF gas.

* * * * *